United States Patent
Solhusvik et al.

(10) Patent No.: US 9,202,591 B2
(45) Date of Patent: Dec. 1, 2015

(54) ON-LINE MEMORY TESTING SYSTEMS AND METHODS

(71) Applicant: OmniVision Technologies, Inc., Santa Clara, CA (US)

(72) Inventors: Johannes Solhusvik, Haslum (NO); Kristoffer Ellersgaard Koch, Oslo (NO); Sohrab Yaghmai, Oslo (NO); Jenny Picalausa, Hakadal (NO)

(73) Assignee: OmniVision Technologies, Inc., Santa Clara, CA (US)

( * ) Notice: Subject to any disclaimer, the term of this patent is extended or adjusted under 35 U.S.C. 154(b) by 291 days.

(21) Appl. No.: 13/892,019

(22) Filed: May 10, 2013

(65) Prior Publication Data

US 2014/0337669 A1 Nov. 13, 2014

(51) Int. Cl.
*G01R 31/28* (2006.01)
*G11C 29/08* (2006.01)
*G11C 29/04* (2006.01)
*G11C 29/26* (2006.01)

(52) U.S. Cl.
CPC ........ *G11C 29/08* (2013.01); *G11C 2029/0401* (2013.01); *G11C 2029/0409* (2013.01); *G11C 2029/2602* (2013.01)

(58) Field of Classification Search
None
See application file for complete search history.

(56) References Cited

U.S. PATENT DOCUMENTS

| 2006/0066630 | A1* | 3/2006 | Rai et al. .................. 345/619 |
| 2006/0190788 | A1* | 8/2006 | Jasinski et al. .............. 714/733 |
| 2008/0162746 | A1* | 7/2008 | Ogura et al. ................ 710/35 |
| 2010/0131811 | A1* | 5/2010 | Eto ........................... 714/721 |
| 2011/0019030 | A1* | 1/2011 | Shoyama ............... 348/231.99 |
| 2011/0102650 | A1* | 5/2011 | Shoyama ................... 348/247 |

* cited by examiner

*Primary Examiner* — April Y Blair
*Assistant Examiner* — Thien D Nguyen
(74) *Attorney, Agent, or Firm* — Lathrop & Gage LLP

(57) ABSTRACT

A method for testing an electronic memory while the memory is in use includes: (a) detecting an access to the electronic memory at a test address, (b) saving, in a register subsystem, write data written to the electronic memory at a location corresponding to the test address, (c) comparing the write data to data read from the electronic memory at the location corresponding to the test address to determine whether the memory has a fault, and (d) generating an error signal if the memory has a fault.

6 Claims, 4 Drawing Sheets

ON-LINE MEMORY TESTING SYSTEMS AND METHODS

BACKGROUND

Many electronic devices include electronic memory. For example, computing devices include electronic memory for storing data and instructions. In another example, image sensors normally include electronic memory to store captured image data until the image data is transferred to external circuitry for processing.

Electronic memory typically includes a large number of memory cells arranged in an array, where each cell stores a data unit, such as one bit of data, in binary form. Each memory cell, or group of memory cells, is accessible for reading or writing via a respective address identifying the cell or cell group. Each memory cell typically includes of one or more transistors, or other electronic devices, for storing a data unit and for interfacing the memory cell with external circuitry.

Memory cells occasionally experience faults, such that they do not reliably store data units. Accordingly, electronic memory test schemes have been developed to identify faulty memory cells. Such schemes are executed when the memory is off-line, such as immediately after memory power-up or during memory manufacturing. For example, a typical computing device performs a "power-on self-test" procedure at power-up to test, among other things, the device's electronic memory.

SUMMARY

In an embodiment, a method for testing an electronic memory while the memory is in use includes: (a) detecting an access to the electronic memory at a test address, (b) saving, in a register subsystem, write data written to the electronic memory at a location corresponding to the test address, (c) comparing the write data to data read from the electronic memory at the location corresponding to the test address to determine whether the memory has a fault, and (d) generating an error signal if the memory has a fault.

In an embodiment, an image sensor includes a pixel array for generating image data, an electronic memory for storing the image data, a memory controller for controlling writing of the image data to the electronic memory and reading of the image data from the electronic memory, and an on-line memory testing system for identifying faults in the memory during normal operation. The on-line memory testing system includes an address detection module for detecting an access to the electronic memory at a test address, a register subsystem for saving write data written to the electronic memory at a location corresponding to the test address, a comparator module for comparing the saved write data to data read from the electronic memory at the location corresponding to the test address to determine whether the memory has a fault, and an error generator module for generating an error signal if the memory has a fault.

In an embodiment, a method for testing an electronic memory while the memory is in use includes: (a) detecting an access to a location within the electronic memory at an address within an address range under test, (b) initializing a write error detection code if the access is a write access and the location is at a beginning address of the address range under test, (c) initializing a read error detection code if the access is a read access and the location is at the beginning address, (d) updating the write error detection code if the access is a write access, (e) updating the read error detection code if the access is a read access, (f) detecting completion of the read error detection code, (g) comparing the write error detection code to the read error detection code when completion is detected to determine if the memory has a fault, and (h) generating an error signal if the memory has a fault.

In an embodiment, an image sensor includes a pixel array for generating image data, an electronic memory for storing the image data, a memory controller for controlling writing of the image data to the electronic memory and reading of the image data from the electronic memory, and an on-line memory testing system for testing the memory during operation. The on-line memory testing system includes an address detection module, a code generator module, a comparator module, and an error generator module. The address detection module is for detecting an access to the electronic memory at a location within an address range under test. The code generator module is for (a) initializing a write error detection code if the access is a write access and the location is at a beginning address of the address range under test, (b) initializing a read error detection code if the access is a read access and the location is at the beginning address, (c) updating the write error detection code if the access is a write access, (d) updating the read error detection code if the access is a read access, and (d) detecting completion of the read error detection code. The comparator module is for comparing, when completion is detected, the write error detection code to the read error detection code to determine if the memory has a fault. The error generator module is for generating an error signal if the memory has a fault.

DETAILED DESCRIPTION OF THE EMBODIMENTS

As discussed above, electronic memory testing schemes have been developed. While such schemes are potentially useful in identifying defective memory cells, they require that the memory be off-line, or in other words, that the memory not be in use during the test. Accordingly, conventional memory test schemes will not detect a memory failure while the memory is in use, such that a system incorporating the memory may operate for an extended time with defective memory. Operation with defective memory may have serious adverse consequences in certain applications. Consider, for example, an image sensor used in a self-driven automobile, where an automated driving system uses image data from the image sensor to navigate the automobile. Failure of one or more memory cells of the image sensor's memory may cause image data distortion that may not be recognized by the automated driving system. Thus, the automated driving system may navigate the vehicle based on inaccurate image data, potentially resulting in risk of vehicle crash and associated injury and/or property damage.

Accordingly, Applicants have developed systems and methods for testing electronic memory while the memory is on-line, or in other words, while the memory is in use. Such systems and methods test the memory without changing contents of data stored therein. Additionally, certain embodiments of these systems and methods are capable of detecting a memory cell failure in substantially real-time, thereby potentially allowing a memory cell failure to be addressed before the failure results in significant adverse consequences. Possible applications of these systems and methods include, but are not limited to, image sensor applications, such that image sensor's memory can be tested while the image sensor is imaging, thereby enabling memory testing without requiring image sensor idle time.

Figure 1:
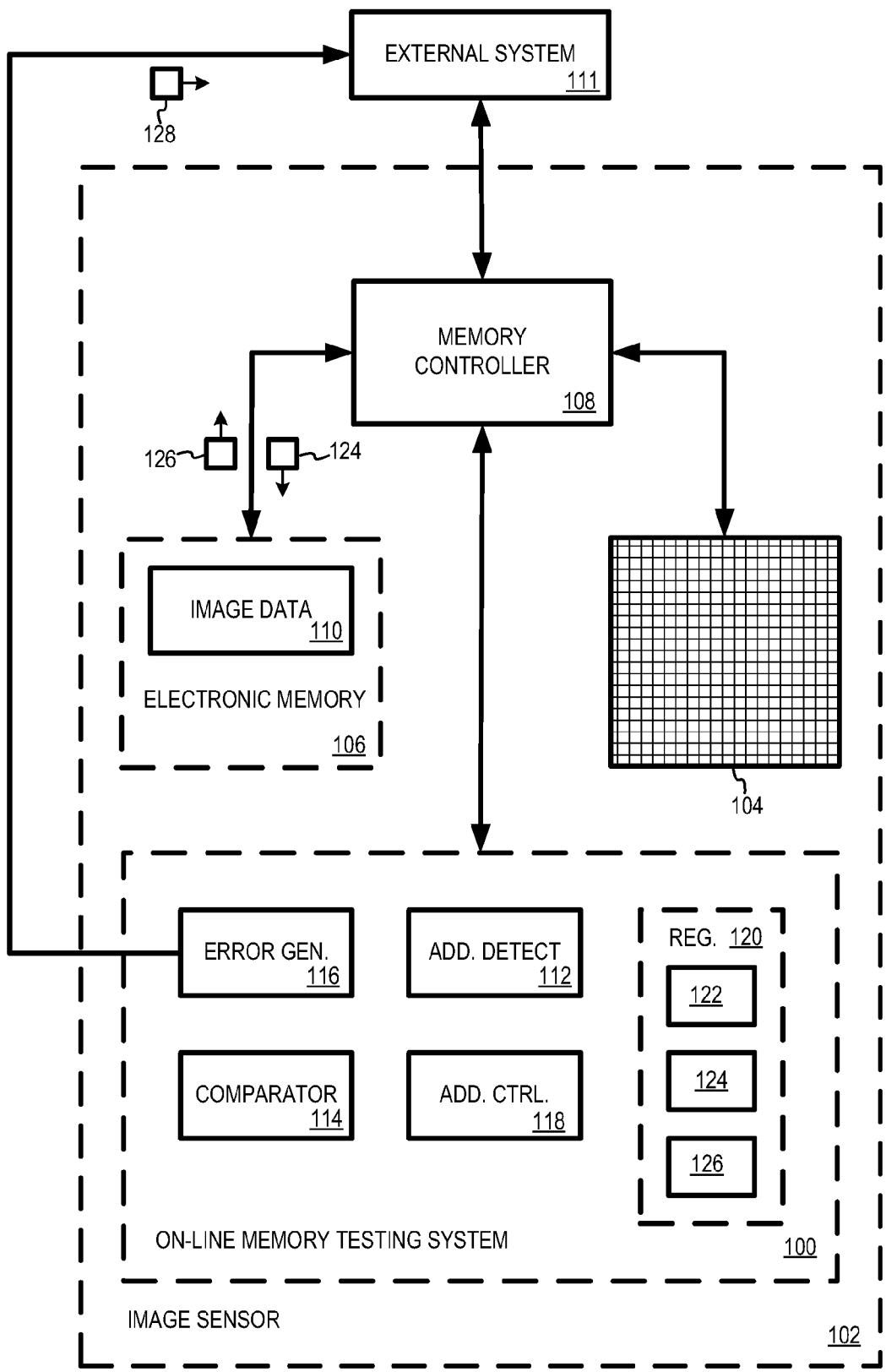
FIG. 1 illustrates one exemplary on-line memory testing system implemented within an image sensor, according to an embodiment.

FIG. 1 illustrates one exemplary on-line memory testing system 100 implemented within an image sensor 102 that includes a pixel array 104, an electronic memory 106, and a memory controller 108. Pixel array 104 captures incident light and converts the captured light into image data 110. Pixel array 104 is, for example, a complementary metal oxide semiconductor (CMOS) pixel array or a charge coupled device (CCD) pixel array. Electronic memory 106 includes a plurality of memory cells (not shown) for storing image data 110 generated by pixel array 104 until the data is transferred to an external system 111, such as an automated driving system, communicatively coupled to image sensor 102. Memory controller 108 is communicatively coupled to pixel array 104, electronic memory 106, and external system 111 and controls operation of electronic memory 106. For example, memory controller 108 controls writing of image data 110 from pixel array 104 to electronic memory 106 and transfer of image data 110, read from electronic memory 106, to external system 111.

On-line memory testing system 100 communicatively couples to memory controller 108 and operates to test electronic memory 106 during normal read/write operation of electronic memory 106, e.g., while image sensor 102 is generating image data 110. On-line memory testing system 100 includes an address detection module 112, a comparator module 114, an error generator module 116, an address control module 118, and a register subsystem 120. On-line memory testing system 100 is adapted to test one location within electronic memory 106 corresponding to a test address 122 stored within register subsystem 120, as follows.

Address control module 118 sets test address 122 to an address within electronic memory 106 that is to be tested. Address detection module 112 monitors operation of memory controller 108 to detect access to the location at test address 122 within electronic memory 106. When address detection module 112 detects a write of data 124 to test address 122, on-line memory testing system 100 stores data 124 within register subsystem 120. When address detection module 112 detects a read of a data 126 from the location at test address 122 within electronic memory 106, system 100 optionally writes data 126 to register subsystem 120.

Comparator module 114 compares read data 126 to write data 124, to determine if the memory location has failed. If read data 126 matches write data 124, the location within electronic memory 106 corresponding to test address 122 is considered to be working properly. On the other hand, if read data 126 does not match write data 124, the location within electronic memory 106 corresponding to test address 122 is considered to have failed, and error generator module 116 is invoked to generate an error signal 128. Image sensor 102 may communicate error signal 128 to external system 111 to indicate failure of electronic memory 106. External system 111 may be configured to take a predetermined action, such as initiating a shut-down procedure, in response to error signal 128. For example, in an application where external subsystem 111 is an automated driving system in a self-driven automobile, the automated driving system may be configured to safely stop the automobile upon receipt of error signal 128.

In one embodiment, on-line memory testing system 100 is configured to sequentially test each location within electronic memory 106 by changing test address 122 after each successful comparison. In one example of operation, address control module 118 initially sets test address 122 to a beginning address of electronic memory 106, and address control module 118 increments test address 122 after testing the memory location corresponding to current test address 122, such that on-line memory testing system 100 sequentially steps through and tests all locations within electronic memory 106 during normal operation of electronic memory 106. After testing all locations within electronic memory 106, address control module 118 may reset test address 122 to restart testing of electronic memory 106 at the beginning address. In another embodiment, address control module 118 controls test address 122 to test locations within electronic memory 106 in reverse order. In another embodiment, address control module 118 sequentially tests randomly selected locations within electronic memory 106, such that the majority of memory locations will likely be tested over time.

On-line memory testing system 100 may be modified to concurrently test multiple locations within electronic memory 106, to improve fault detection speed within electronic memory 106. For example, one alternate embodiment of on-line memory testing system 100 is capable of simultaneously testing locations within electronic memory 106 corresponding to at least two different addresses.

Although FIG. 1 shows on-line memory testing system 100, pixel array 104, electronic memory 106, and memory controller 108 as being discrete elements, one or more of these elements may be combined without departing from the scope hereof. For example, in one embodiment, on-line memory testing system 100 is incorporated within memory controller 108. In certain embodiments, on-line memory testing system 100 is implemented in discrete logic.

Figure 2:
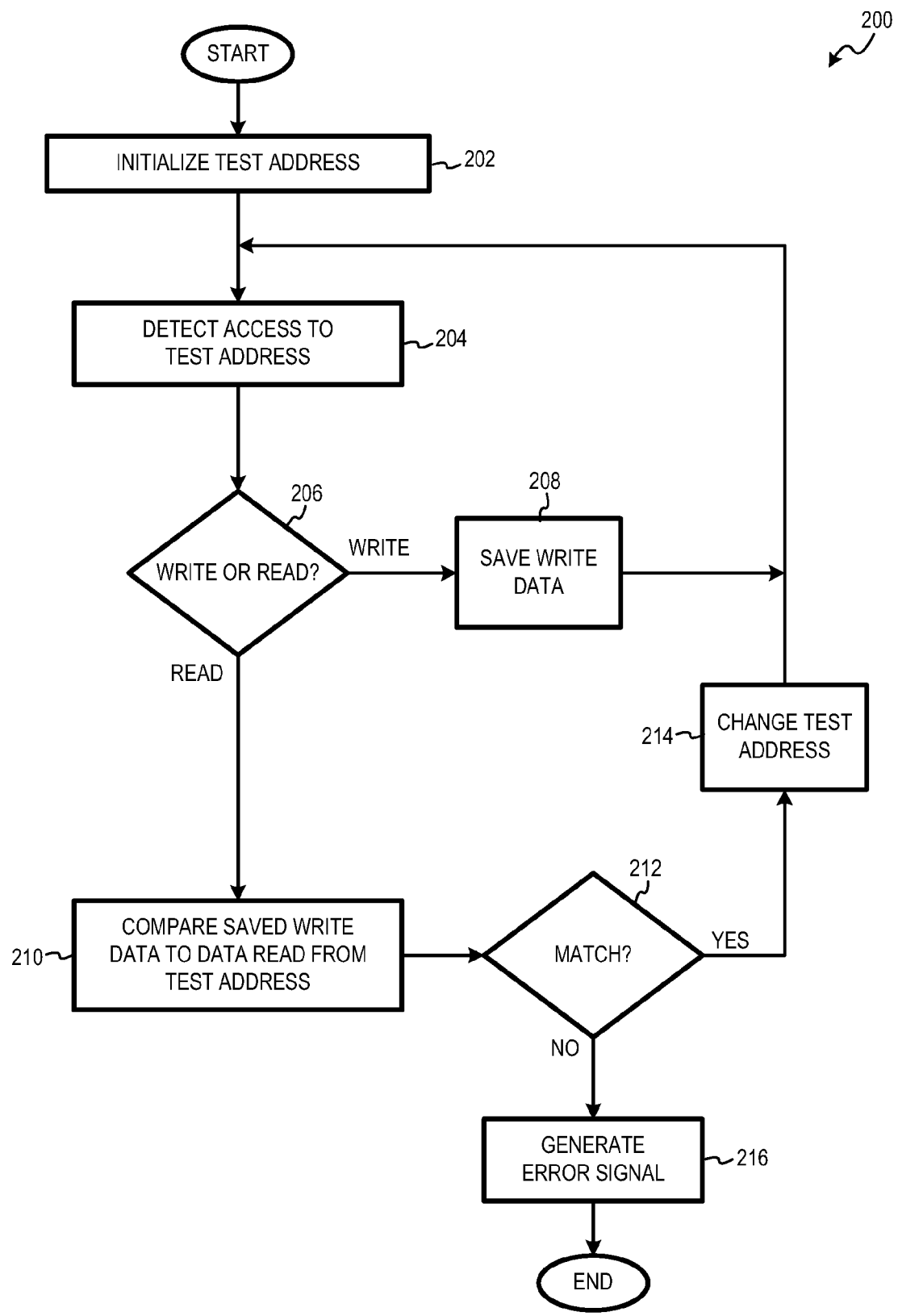
FIG. 2 illustrates one exemplary method for testing an electronic memory while the memory is in use, according to an embodiment.

FIG. 2 illustrates one exemplary method 200 for testing an electronic memory while it is in use. Method 200 is implemented within on-line memory testing system 100 of FIG. 1 for example. Although method 200 is discussed below with respect to image sensor 102 of FIG. 1, it should be appreciated that method 200 may be used with memory of other devices. Additionally, on-line memory testing system 100 of image sensor 102 may operate under a method other than that of FIG. 2.

In step 202, method 200 initializes a test address corresponding to a location within the electronic memory to be tested. In one example of step 202, address control module 118 of FIG. 1 initializes test address 122 to the beginning address of electronic memory 106. In step 204, method 200 detects access to the test address. In one example of step 204, address detection module 112 detects access to a location within test address 122 of electronic memory 106 identified by test address 122. Step 206 is a decision. If, in step 206, method 200 determines that the access detected in step 204 is a write access, method 200 continues with step 208; otherwise method 200 continues with step 210. On step 208, method 200 saves a copy of the write data. In one example of step 208, on-line memory testing system 100 saves write data 124 in register subsystem 120. Method 200 then continues with step 204.

In step 210, method 200 compares previously saved write data to data read from the electronic memory at the test address. In one example of step 210, comparator module 114 compares write data 124 to read data 126. Step 212 is a decision. If, in step 212, method 200 determines that the saved write data matches the data read from the electronic memory at the address under test, method 200 continues with step 214; otherwise, method 200 continues with step 216.

In step 214, method 200 changes the test address. In one example of step 214, address control module 118 increments test address 122 to the next address within electronic memory 106. Method 200 then continues with step 204. Steps 204 through 214 repeat to test other addresses within electronic memory 106.

In step 216, method 200 generates an error signal. In one example of step 216, error generator module 116 generates error signal 128 to indicate a fault with electronic memory 106.

Figure 3:
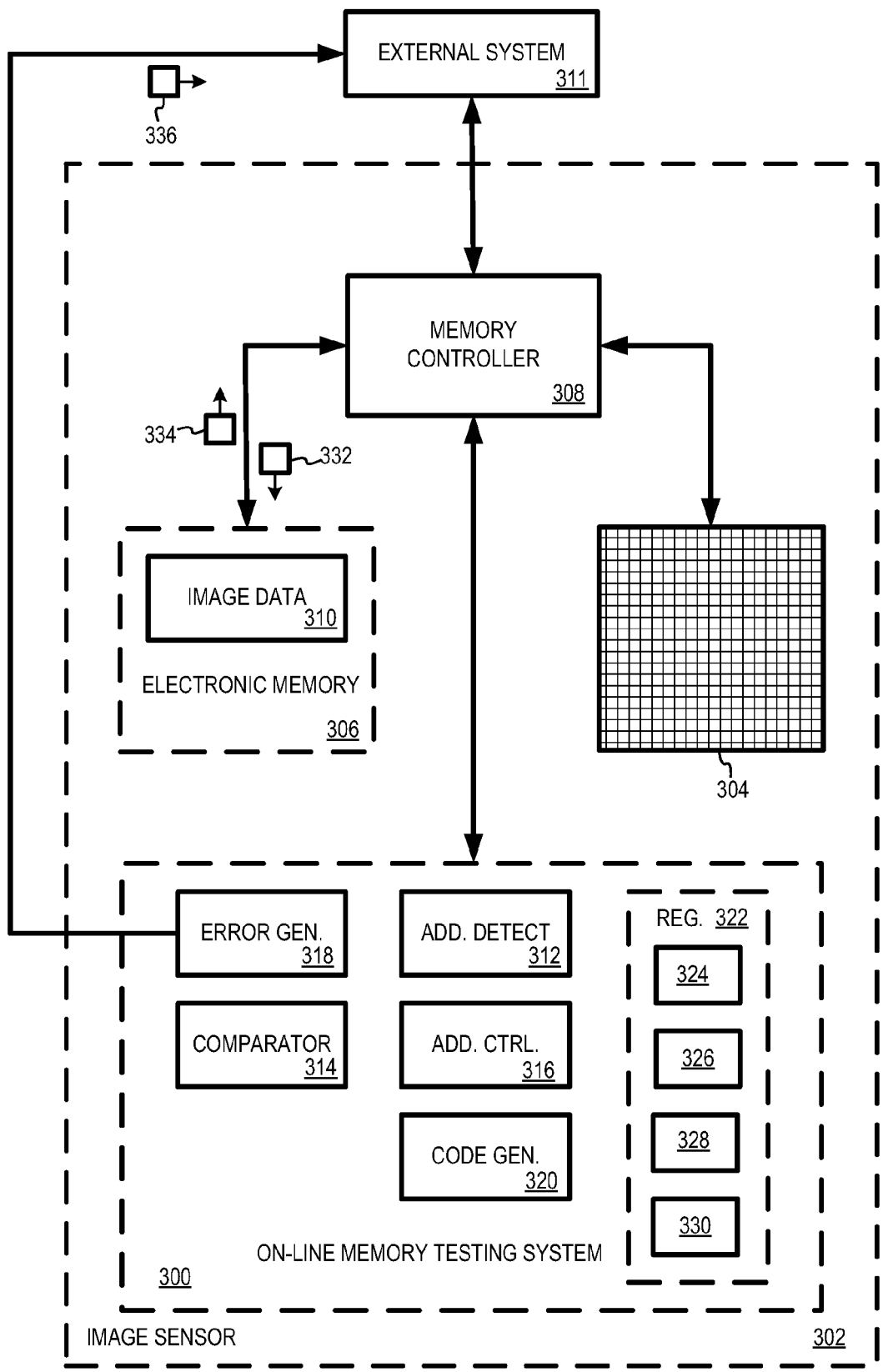
FIG. 3 illustrates one exemplary on-line memory testing system implemented within an image sensor, according to an embodiment.

FIG. 3 illustrates one exemplary on-line memory testing system 300 implemented in an image sensor 302 that includes a pixel array 304, an electronic memory 306, and a memory controller 308. Pixel array 304, electronic memory 306, and memory controller 308 are analogous to pixel array 104, electronic memory 106, and memory controller 108 of FIG. 1. During operation of image sensor 302, image data 310 is sequentially written to electronic memory 306 (e.g., from a first address of electronic memory 306 to a last address of electronic memory 306), and image sensor 302 sequentially reads image data 310 from electronic memory 306 (e.g., from the first address of electronic memory 306 to the last address of electronic memory 306).

On-line memory testing system 300 communicatively couples to memory controller 308 and operates to test electronic memory 306 during normal read/write operation of electronic memory 306, e.g., while image sensor 302 is generating image data 310. On-line memory testing system 300 includes an address detection module 312, a comparator module 314, an address control module 316, an error generator module 318, a code generator module 320, and a register subsystem 322. On-line memory testing system 300 operates to test locations within electronic memory 306 corresponding to an address range under test, as follows.

Address control module 316 sets a range of addresses of electronic memory 306 for testing. Specifically, address control module 316 sets in register subsystem 322 a beginning address 324 and an ending address 326 of the address range under test. Beginning and ending address 324, 326 respectively are within the memory locations used during normal operation of image sensor 302. The address range under test may include some or all locations within electronic memory 306.

Address detection module 312 detects access to electronic memory 306 at any address within the address range bounded by beginning address 324 and ending address 326. When address detection module 312 detects a write access to the location within electronic memory 306 identified by beginning address 324, code generator module 320 initializes a write error detection code 328 in register subsystem 322. In one embodiment, write error detection code 328 is cleared, and in another embodiment, write error detection code 328 is set to write data 332. Each time address detection module 312 detects a write access to a location of electronic memory 306 within the address range under test (i.e., bounded by beginning address 324 and ending address 326), code generator module 320 updates write error detection code 328 in register subsystem 322, using write data 332. As discussed above, image data 310 is sequentially written to electronic memory 306, and code generator module 320 therefore sequentially updates write error detection code 328 as image data 310 is written to electronic memory 306 at locations from beginning address 324 to ending address 326.

When address detection module 312 detects a read access to the location within electronic memory 306 identified by beginning address 324, code generator module 320 initializes a read error detection code 330 in register subsystem 322. In one embodiment, code generator module 320 clears read error detection code 330, and in another embodiment, code generator module 320 writes read data 334 to read error detection code 330. Each time address detection module 312 detects a read access from a location within electronic memory 306 within the address range under test, code generator module 320 updates read error detection code 330 based upon read data 334. As discussed above, image data 310 is sequentially read from electronic memory 306, and code generator module 320 therefore sequentially updates read error detection code 330 based upon read data 334 as image data 310 is read from locations at addresses bounded by beginning address 324 and ending address 326 within electronic memory 306. In certain embodiments, code generator module 320 determines read and write error detection codes 328, 330 respectively, using a cyclic redundancy check (CRC) technique, such that each of error detection codes 328, 330 are CRC values of data written to, and data read from, electronic memory 306 at address locations within the address range under test, respectively.

Since writing and reading of image data 310 is sequential, both write and read error correction codes 328, 330 respectively, for the address range under test may be compared after code generator module 320 updates read error detection code 330 for ending address 326, wherein comparator module 314 is invoked to compare write error detection code 328 with read error detection code 330. Matching of write and read error detection code 328, 330 respectively, indicates proper operation of locations within electronic memory 306 corresponding to the address range under test. Mismatch of write and read error detection codes 328, 330, respectively, however, indicates improper operation of one or more locations within electronic memory 306 within the address range under test. Thus, when comparator module 314 determines that write and read detection codes 328, 330 respectively, do not match, error generator module 318 is invoked to generate an error signal 336 to indicate an error with electronic memory 306. Image sensor 302 may communicate error signal 336 to an external system 311 to signal the electronic memory 306 error. External system 311 may be configured to take a predetermined action, such as initiating a shut-down procedure, in response to error signal 336.

In one embodiment, on-line memory testing system 300 is configured to sequentially test each location within electronic memory 306 by changing the address range under test. In some embodiments, address control module 316 initially sets the address range under test to a beginning block of sequential addresses, and increments the address range under test after the current address range is tested, such that on-line memory testing system 300 sequentially steps through and tests all locations within electronic memory 306 during normal operation of electronic memory 306. In another embodiment, address control module 316 sequentially tests randomly selected blocks of sequential addresses, such that the majority of electronic memory 306 locations will likely be tested over time.

In certain alternate embodiments, the address range under test includes a predefined number of sequential addresses, such that only one of beginning address 324 and ending address 326 is required to determine the address range under test. For example, in one particular alternate embodiment, the address range under test starts at the location identified by beginning address 324 and has a predefined number of sequential addresses after beginning address 324, such that the address range under test is determined solely from beginning address 324. Accordingly, certain alternate embodiments store only one of beginning address 324 and ending address 326 in register subsystem 322.

In another embodiment, beginning address 324 stored only a most significant portion of the memory address, wherein the size of the address range under test is determined by the portion of the address not stored within beginning address 324.

Although FIG. 3 shows on-line memory testing system 300, pixel array 304, electronic memory 306, and memory controller 308 as being discrete elements, one or more of these elements could be combined without departing from the scope hereof. For example, in an alternative embodiment, system 300 is combined with memory controller 308. In certain embodiments, system 300 is implemented in discrete logic.

Figure 4:
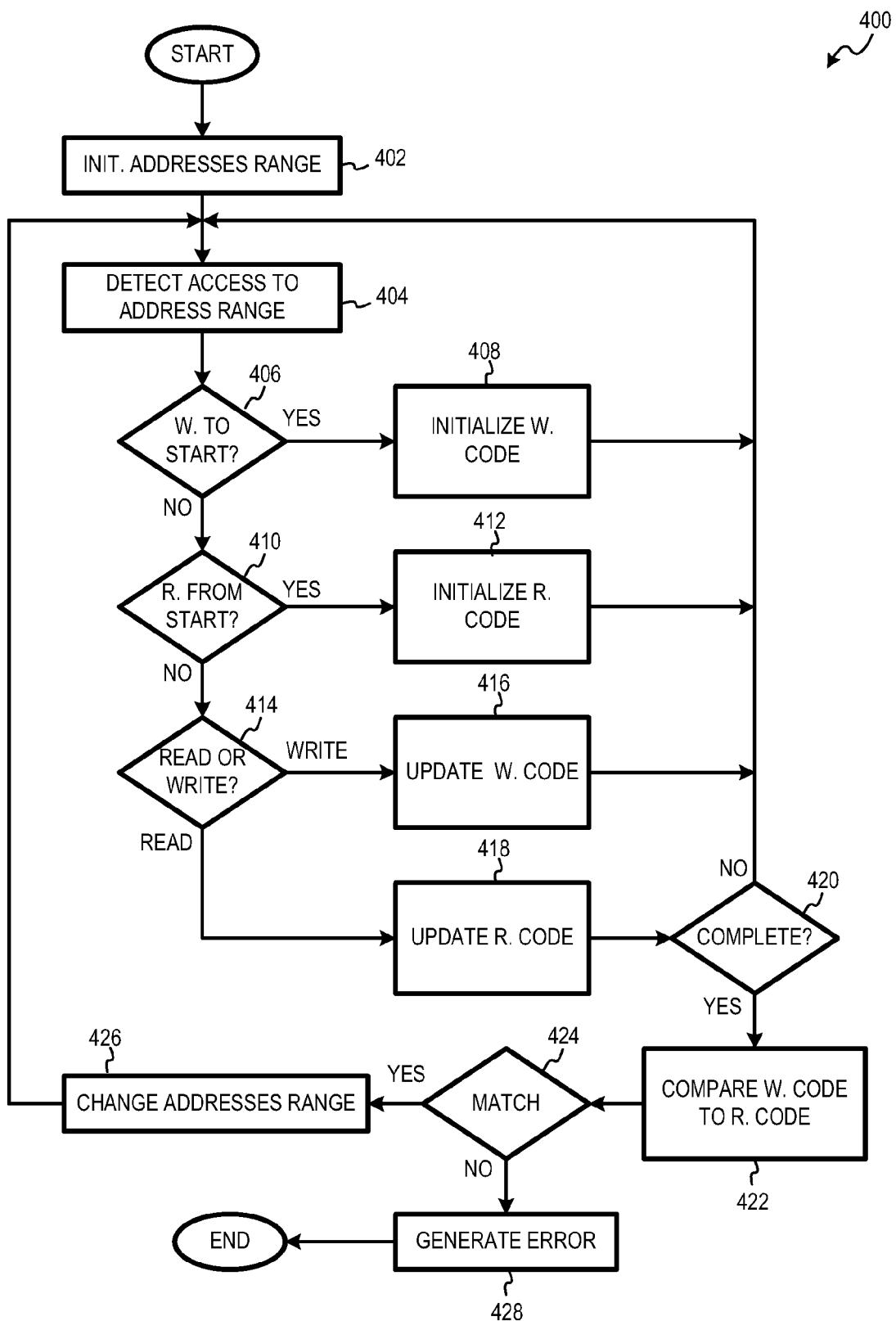
FIG. 4 illustrates one exemplary method for testing an electronic memory while the memory is in use, according to an embodiment.

FIG. 4 illustrates one exemplary method 400 for testing an electronic memory while it is in use. Method 400 is implemented within system 300 of FIG. 3 for example. Although method 400 is discussed below with respect to image sensor 302 of FIG. 3, it should be appreciated that method 400 may be used with memory of other devices. Additionally, on-line memory testing system 300 of image sensor 302 may operate under a method other than that of FIG. 4.

In step 402, method 400 initializes an address range under test. In one example of step 402, address control module 316 sets beginning address 324 and/or ending address 326 to define an address range under test (see FIG. 3). In step 404, method 400 detects access to an address within this address range under test. In one example of step 404, address detection module 312 detects access to an address within the address range bounded by beginning address 324 and ending address 326.

Step 406 is a decision. If, in step 406, method 400 determines that the access detected in step 404 is a write access to a beginning address of the address range under test, method 400 continues with step 408; otherwise method 400 continues with step 410. In step 408, method 400 initializes a write error detection code. In one example of step 408, code generator module 320 clears write error detection code 328. Method 400 then continues with step 404.

Step 410 is a decision. If, in step 410, method 400 determines that the detected access is a read access from the beginning address of the address range under test, method 400 continues with step 412; otherwise method 400 continues with step 414. In step 412, method 400 initializes a read error detection code. In one example of step 412, code generator module 320 clears read error detection code 330. Method 400 then continues with step 404.

Step 414 is a decision. If, in step 414, method 400 determines that the detected access is a write access to another address within the address range under test, method 400 continues with step 416; otherwise method 400 continues with step 418. In step 416, method 400 updates the write error detection code based upon the data written to the electronic memory at the address detected in step 404. In one example of step 416, code generator module 320 updates write error detection code 328 based upon image data 332 written to electronic memory 306. Method 400 then continues with step 404.

In step 418, method 400 updates the read error detection code based upon the data read from the electronic memory at the address detected in step 404. In one example of step 418, code generator module 320 updates read error detection code 330 based upon image data 334 read from electronic memory 306 at the address detected in step 404.

Step 420 is a decision. If, in step 420, method 400 determines that the read error detection code is complete, method 400 continues with step 422; otherwise method 400 continues with step 404. In one example of decision step 420, the read error detection code is complete when a value was read from the location corresponding to ending address 326 within electronic memory 306. Steps 404-420 repeat to test all locations within the current address range under test.

In step 422, method 400 compares the write error detection code to the read error detection code. In one example of step 422, comparator module 314 compares write error detection code 328 to read error detection code 330. Step 424 is a decision. If, in step 424, method 400 determines that the codes match, method 400 continues with step 426; otherwise method 400 continues with step 428. In step 426, method 400 changes the address range under test. In one example of step 426, address control module 316 sets beginning and ending addresses 324, 326 to encompass a next block of sequential addresses within electronic memory 306. Method 400 then continues with step 404. Steps 404 through 426 repeat to test all blocks within electronic memory 306 for example.

In step 428, method 400 generates an error signal. In one example of step 428, error generator module 318 generates an error signal 336 to indicate an error in electronic memory 306.

Combinations of Features

Features described above as well as those claimed below may be combined in various ways without departing from the scope hereof. The following examples illustrate some possible combinations:

(A1) A method for testing an electronic memory while the memory is in use may include (a) detecting an access to the electronic memory at a test address, (b) saving, in a register subsystem, write data written to the electronic memory at a location corresponding to the test address, (c) comparing the write data to data read from the electronic memory at the location corresponding to the test address to determine whether the memory has a fault, and (d) generating an error signal if the memory has a fault.

(A2) The method denoted as (A1) may further include, after the step of comparing, (a) changing the test address to reference an untested location of the memory if the memory does not have a fault, and (b) repeating the steps of detecting, saving, comparing, and generating.

(A3) Either of the methods denoted as (A1) or (A2) may further include initializing the test address prior to the step of detecting the access to the electronic memory.

(A4) Any of the methods denoted as (A1) through (A3) may further include saving, in the register subsystem, the data read from the electronic memory at the location corresponding to the test address, prior to the step of comparing.

(B1) An image sensor may include a pixel array for generating image data, an electronic memory for storing the image data, a memory controller for controlling writing of the image data to the electronic memory and reading of the image data from the electronic memory, and an on-line memory testing system for identifying faults in the memory during normal operation. The on-line memory testing system may include an address detection module for detecting an access to the electronic memory at a test address, a register subsystem for saving write data written to the electronic memory at a location corresponding to the test address, a comparator module for comparing the saved write data to data read from the electronic memory at the location corresponding to the test address to determine whether the memory has a fault, and an error generator module for generating an error signal if the memory has a fault.

(B2) The image sensor denoted as (B1) may further include an address control module for changing the test address to reference an untested location of the memory if the memory does not have a fault.

(B3) In either of the image sensors denoted as (B1) or (B2), the register subsystem may be further adapted to store the data read from the electronic memory at the location corresponding to the test address.

(C1) A method for testing an electronic memory while the memory is in use may include: (a) detecting an access to a location within the electronic memory at an address within an address range under test, (b) initializing a write error detection code if the access is a write access and the location is at a beginning address of the address range under test, (c) initializing a read error detection code if the access is a read access and the location is at the beginning address, (d) updating the write error detection code if the access is a write access, (e) updating the read error detection code if the access is a read access, (f) detecting completion of the read error detection code, (g) comparing the write error detection code to the read error detection code when completion is detected to determine if the memory has a fault, and (h) generating an error signal if the memory has a fault.

(C2) In the method denoted as (C1), the step of initializing the write error detection code and the step of updating the write error detection code may each include determining a cyclic redundancy check value of data written to the location.

(C3) In either of the methods denoted as (C1) or (C2), the step of initializing the read error detection code and the step of updating the read error detection code may each include determining a cyclic redundancy check value of data read from the location.

(C4) Any of the methods denoted as (C1) through (C3) may further include initializing the address range under test, prior to the step of detecting the access to the electronic memory at the address within the address range under test.

(C5) Any of the methods denoted as (C1) through (C4) may further include, after the step of comparing, changing the address range under test to include at least one untested location of the memory.

(D1) An image sensor may include a pixel array for generating image data, an electronic memory for storing the image data, a memory controller for controlling writing of the image data to the electronic memory and reading of the image data from the electronic memory, and an on-line memory testing system for testing the memory during operation. The on-line memory testing system may include an address detection module, a code generator module, a comparator module, and an error generator module. The address detection module is for detecting an access to the electronic memory at a location within an address range under test. The code generator module is for: (a) initializing a write error detection code if the access is a write access and the location is at a beginning address of the address range under test, (b) initializing a read error detection code if the access is a read access and the location is at the beginning address, (c) updating the write error detection code if the access is a write access, (d) updating the read error detection code if the access is a read access, and (e) detecting completion of the read error detection code. The comparator module is for comparing, when completion is detected, the write error detection code to the read error detection code to determine if the memory has a fault. The error generator module is for generating an error signal if the memory has a fault.

(D2) In the image sensor denoted as (D1), the code generator module may be adapted to determine a cyclic redundancy check value of data written to and data read from the electronic memory at the location.

(D3) In either of the image sensors denoted as (D1) or (D2), the on-line memory testing system may further include an address control module adapted to: (a) set at least a beginning address of the address range under test, and/or (b) change the address range under test when the comparator module indicates that the electronic memory does not have a fault.

Changes may be made in the above methods and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A method for testing an electronic memory while the electronic memory is in use, comprising:
    initializing a write error detection code in response to a write access to the electronic memory at a location at a beginning address of an address range under test;
    initializing a read error detection code in response to a read access to the electronic memory at the location at the beginning address of the address range under test;
    updating the write error detection code in response to each write access to the electronic memory at a location within the address range under test, such that a final value of the write error detection code is a cyclic redundancy check (CRC) value of data written to the electronic memory at each location within the address range under test;
    updating the read error detection code in response to each read access to the electronic memory at a location within the address range under test, such that a final value of the read error detection code is a CRC value of data read from the electronic memory at each location within the address range under test;
    comparing the final value of the write error detection code to the final value of the read error detection code to determine if the electronic memory has a fault; and
    generating an error signal if the electronic memory has a fault.

2. The method of claim 1, further comprising initializing the address range under test.

3. The method of claim 2, further comprising, after the step of comparing, changing the address range under test to include at least one untested location of the electronic memory.

4. An image sensor, comprising:
    a pixel array for generating image data;
    an electronic memory for storing the image data;
    a memory controller for controlling writing of the image data to the electronic memory and reading of the image data from the electronic memory; and
    an on-line memory testing system for testing the electronic memory during operation, comprising:
        a code generator module for:

initializing a write error detection code in response to a write access to the electronic memory at a location at a beginning address of an address range under test, initializing a read error detection code in response to a read access to the electronic memory at the location at the beginning address of the address range under test, updating the write error detection code in response to each write access to the electronic memory at a location within the address range under test, such that a final value of the write error detection code is a cyclic redundancy check (CRC) value of data written to the electronic memory at each location within the address range under test, updating the read error detection code in response to each read access to the electronic memory at a location within the address range under test, such that a final value of the read error detection code is a CRC value of data read from the electronic memory at each location within the address range under test, and a comparator module for comparing the final value of the write error detection code to the final value of the read error detection code to determine if the electronic memory has a fault, and an error generator module for generating an error signal if the electronic memory has a fault.

5. The image sensor of claim 4, the on-line memory testing system further including an address control module adapted to set at least a beginning address of the address range under test.

6. The image sensor of claim 4, the on-line memory testing system further comprising an address controller for changing the address range under test when the comparator module indicated that the electronic memory does not have a fault.

\* \* \* \* \*